(12) United States Patent
Bauer et al.

(10) Patent No.: US 7,713,791 B2
(45) Date of Patent: May 11, 2010

(54) PANEL AND SEMICONDUCTOR DEVICE HAVING A COMPOSITE PLATE WITH SEMICONDUCTOR CHIPS

(75) Inventors: Michael Bauer, Nittendorf (DE); Thomas Bemmerl, Schwandorf (DE); Edward Fuergut, Dasing (DE); Simon Jerebic, Regensburg (DE); Hermann Vilsmeier, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 293 days.

(21) Appl. No.: 11/437,304

(22) Filed: May 19, 2006

(65) Prior Publication Data

US 2006/0265860 A1 Nov. 30, 2006

(30) Foreign Application Priority Data

May 20, 2005 (DE) ........................ 10 2005 023 949

(51) Int. Cl.
*H01L 21/00* (2006.01)
(52) U.S. Cl. ............................... 438/127; 257/E21.502
(58) Field of Classification Search ................ 438/112, 438/124, 108, 126, 127; 257/E21.502
See application file for complete search history.

(56) References Cited

U.S. PATENT DOCUMENTS

| | | | | |
|---|---|---|---|---|
| 5,173,766 A * | 12/1992 | Long et al. | ................... | 257/687 |
| 5,313,365 A * | 5/1994 | Pennisi et al. | ............... | 361/760 |
| 5,386,342 A * | 1/1995 | Rostoker | ................... | 361/749 |
| 5,847,445 A * | 12/1998 | Wark et al. | ................... | 257/669 |
| 5,847,929 A * | 12/1998 | Bernier et al. | ............... | 361/719 |
| 5,980,683 A * | 11/1999 | Beck et al. | ................... | 156/289 |
| 5,981,312 A * | 11/1999 | Farquhar et al. | ............ | 438/112 |
| 6,069,023 A * | 5/2000 | Bernier et al. | ............... | 438/107 |
| 6,407,461 B1 * | 6/2002 | Farquhar et al. | ............ | 257/787 |
| 6,605,779 B2 * | 8/2003 | Takata et al. | ................. | 174/559 |
| 6,791,173 B2 * | 9/2004 | Saga | ........................... | 257/678 |

(Continued)

FOREIGN PATENT DOCUMENTS

DE       10213296 A1    10/2003

(Continued)

OTHER PUBLICATIONS

Petrie, Edward M. (2000). Handbook of Adhesives and Sealants. (pp. 49-91, 415-449 ). McGraw-Hill. Online version available at: http://knovel.com/web/portal/browse/display?_EXT_KNOVEL_DISPLAY_bookid=610&VerticalID=0.*

*Primary Examiner*—Matthew Smith
*Assistant Examiner*—Jarrett J Stark
(74) *Attorney, Agent, or Firm*—Dicke, Billig & Czaja, PLLC

(57) ABSTRACT

The invention relates to a panel and a semiconductor device including a composite plate with semiconductor chips and a plastic packaging compound, and to processes for producing them. For this purpose, the panel having a composite plate has semiconductor chips arranged in rows and columns on a top side of a wiring substrate. The wiring substrate is covered by a plastic packaging compound in a plurality of semiconductor device positions, the rear sides of the semiconductor chips being fixed on the wiring substrate. A plastic packaging compound in the region of the boundary surfaces with the semiconductor chips has a coefficient of thermal expansion which is matched to that of silicon, while the remaining plastic packaging compound has a coefficient of thermal expansion which is matched to that of the wiring substrate and is therefore correspondingly higher.

17 Claims, 5 Drawing Sheets

U.S. PATENT DOCUMENTS

| | | | |
|---|---|---|---|
| 6,962,829 B2 * | 11/2005 | Glenn et al. | 438/33 |
| 7,145,253 B1 * | 12/2006 | Kim et al. | 257/790 |
| 2001/0012540 A1 * | 8/2001 | Gochnour et al. | 427/96 |
| 2002/0100969 A1 * | 8/2002 | Farquhar et al. | 257/717 |
| 2002/0121694 A1 * | 9/2002 | Gaynes et al. | 257/738 |
| 2003/0071348 A1 | 4/2003 | Eguchi et al. | |

FOREIGN PATENT DOCUMENTS

| | | |
|---|---|---|
| EP | 1394855 A2 | 3/2004 |
| WO | WO 2004/082018 A2 | 9/2004 |

* cited by examiner

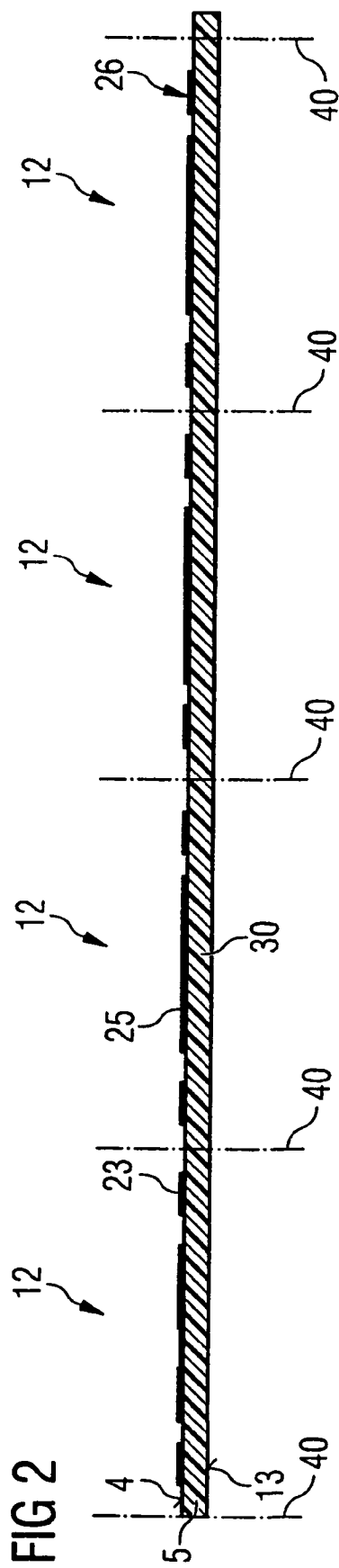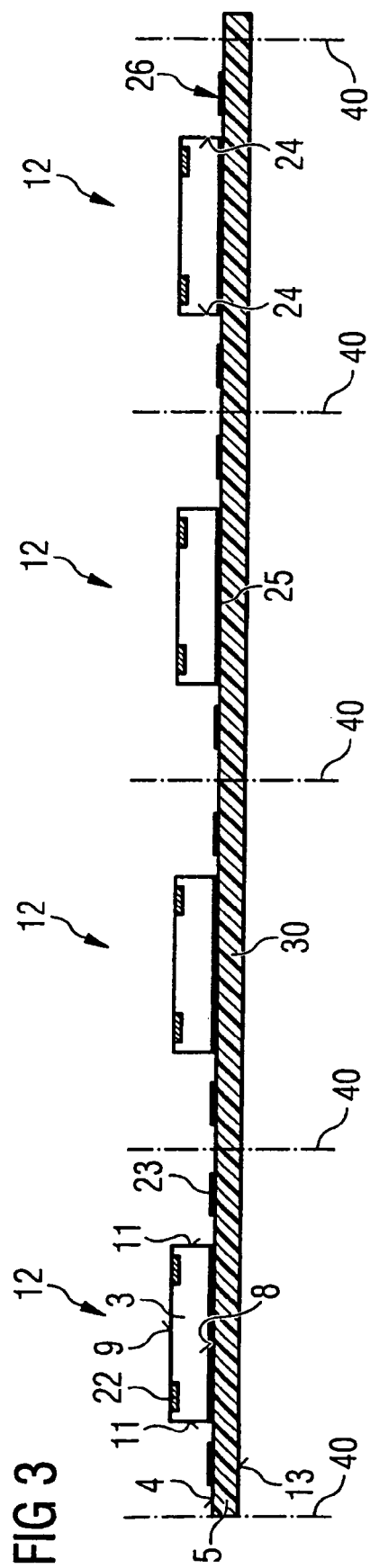

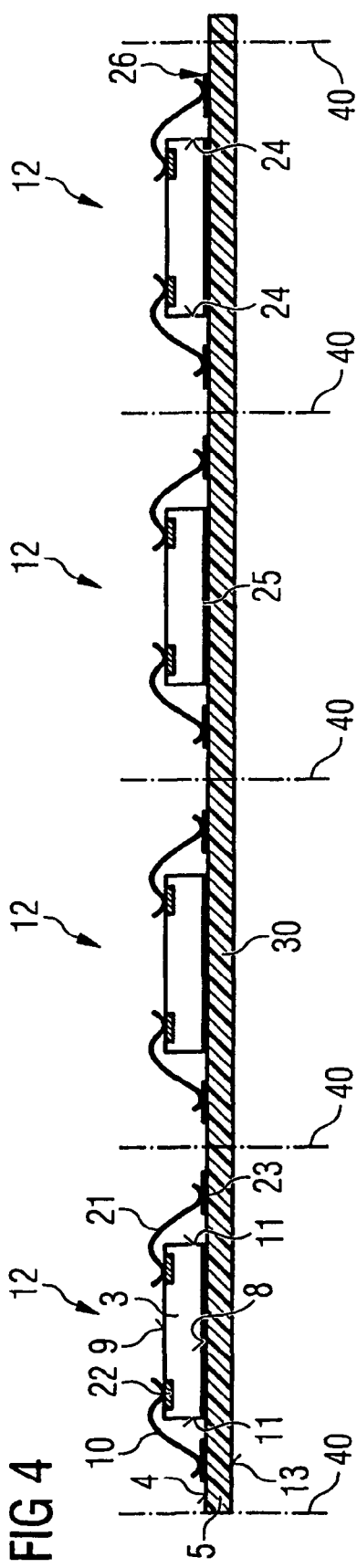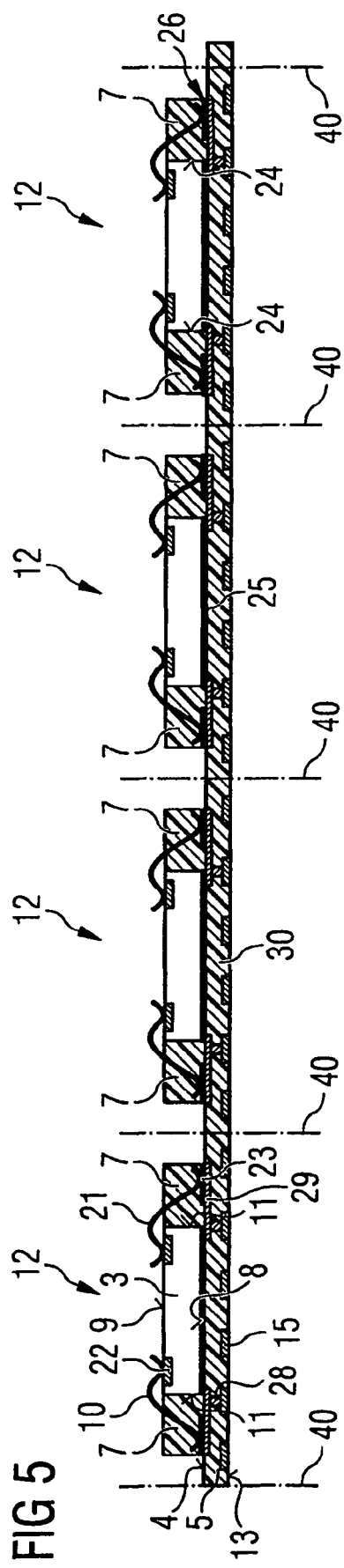

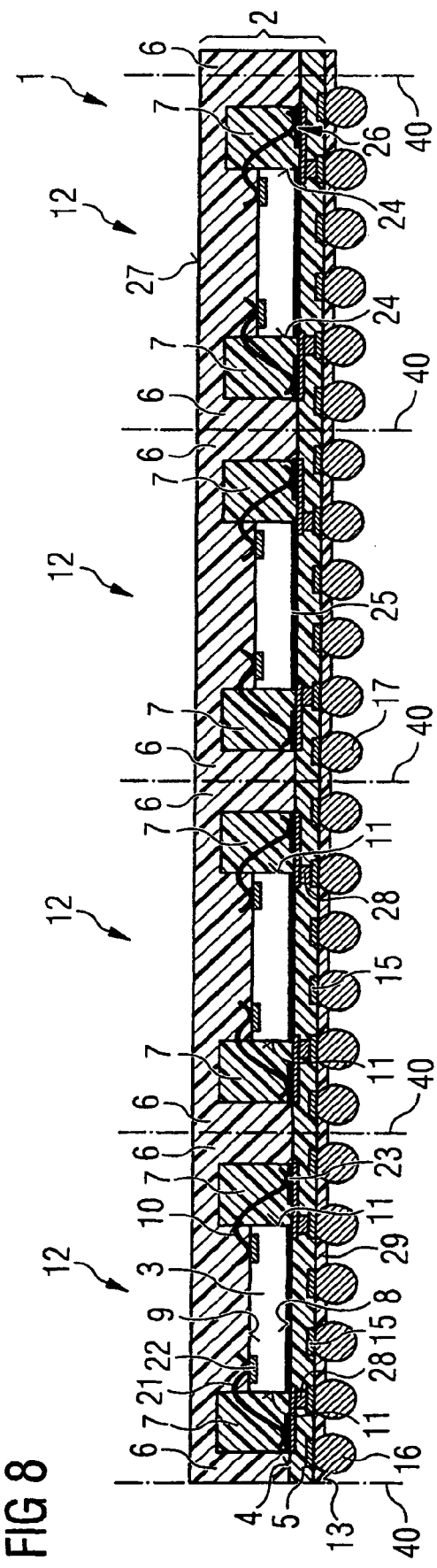
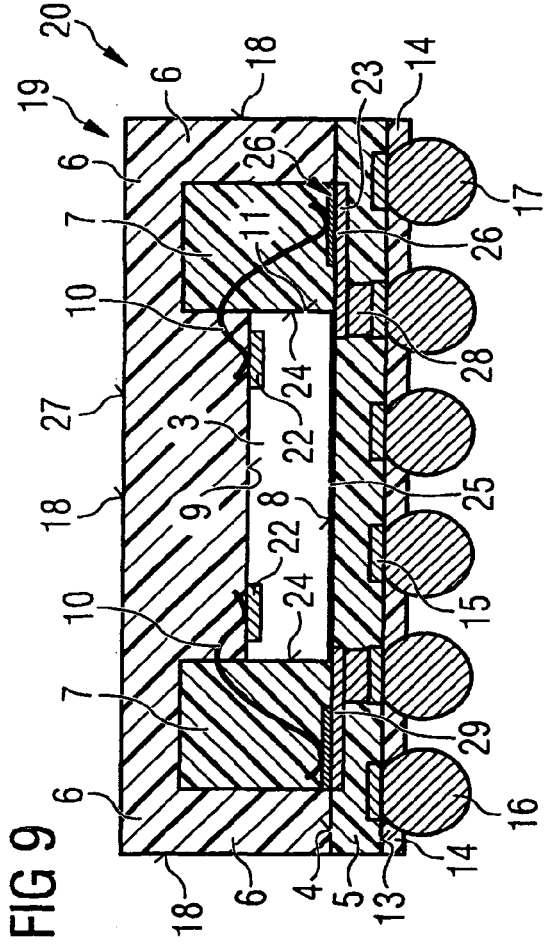
FIG 8
FIG 9

PANEL AND SEMICONDUCTOR DEVICE HAVING A COMPOSITE PLATE WITH SEMICONDUCTOR CHIPS

CROSS-REFERENCE TO RELATED APPLICATIONS

This Utility Patent Application claims priority to German Patent Application No. DE 10 2005 023 949.8 filed on May 20, 2005, which is incorporated herein by reference.

BACKGROUND

The invention relates to a panel and a semiconductor device comprising a composite plate with semiconductor chips. This composite plate, in addition to the semiconductor chips, also has a plastic packaging compound. The invention also relates to a process for producing a panel and a semiconductor device.

FIELD OF THE INVENTION

A panel for the production of a multiplicity of semiconductor devices is known from document DE 102 13 296 A. A panel of this type comprises a multiplicity of semiconductor device positions arranged in rows and columns with semiconductor chips embedded in a plastic compound. Furthermore, it is known from document DE 102 13 296 A that one problem with a panel of this type is that considerable distortion of the panel can occur during the production process, on account of the different expansion coefficients between a carrier substrate and the plastic packaging compound and the semiconductor chips embedded therein. This can even lead to delamination between the carrier substrate and the plastic packaging compound.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2-8 illustrate diagrammatic cross sections through intermediate products involved in the production of the panel illustrated in FIG. 1.

FIG. 2 illustrates a diagrammatic cross section through a wiring substrate with contact connection surfaces and semiconductor chip contact surfaces of a wiring substrate.

FIG. 3 illustrates a diagrammatic cross section through the wiring substrate illustrated in FIG. 2 after semiconductor chips have been applied in semiconductor device positions of the wiring substrate.

FIG. 4 illustrates shows a diagrammatic cross section through the wiring substrate from FIG. 3 after the application of connecting elements.

FIG. 5 illustrates a diagrammatic cross section through the wiring substrate illustrated in FIG. 4 after a plastic packaging compound with a low coefficient of thermal expansion has been applied to the boundary surfaces of the semiconductor chip.

FIG. 6 illustrates a diagrammatic cross section through a composite plate after a plastic packaging compound has been applied to the wiring substrate illustrated in FIG. 5.

FIG. 7 illustrates a diagrammatic cross section through a panel after a soldering stop resist layer has been applied to the underside of the wiring substrate illustrated in FIG. 6.

FIG. 8 illustrates a diagrammatic cross section through a panel after outer contacts have been applied to the underside of the wiring substrate illustrated in FIG. 7.

FIG. 9 illustrates a diagrammatic cross section through a semiconductor device after the panel illustrated in FIG. 8 has been divided.

DETAILED DESCRIPTION

Figure 1:
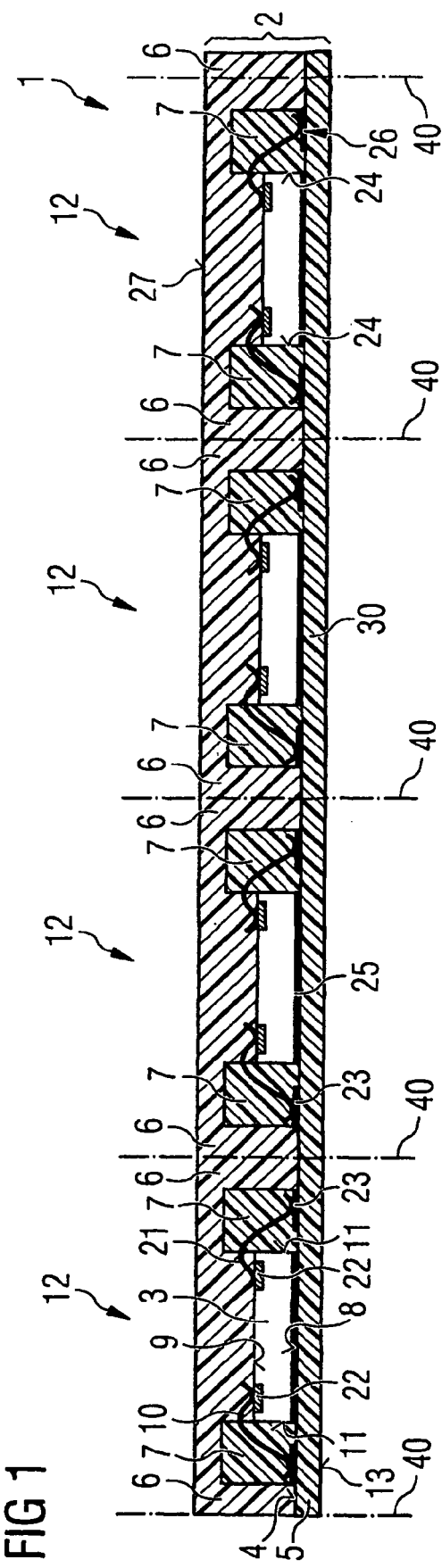
FIG. 1 illustrates a diagrammatic cross section through a panel in accordance with one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a panel and a semiconductor device having a composite plate which can be produced at lower cost and in which the risk of delamination caused by the different expansion coefficients between semiconductor material and plastic packaging material as well as the material of the joint carrier is overcome.

In one embodiment, the invention provides a panel having a composite plate with semiconductor chips arranged in rows and columns on a top side of a wiring substrate in a plastic packaging compound in a plurality of semiconductor device positions. For this purpose, the rear sides of the semiconductor chips are fixed on the wiring substrate, while their active top sides are electrically connected to the wiring substrate via connecting elements. The plastic packaging compound embeds the semiconductor chips with the connecting elements. Moreover, the plastic packaging compound, at the boundary surfaces with the semiconductor chips, has a coefficient of thermal expansion which is matched to that of silicon and which merges between the semiconductor chips into a coefficient of thermal expansion which is matched to that of the wiring substrate.

This panel has a plastic packaging compound with a variable coefficient of thermal expansion, a gradual transition being created from the boundary surfaces of the semiconductor chip and therefore from a low expansion coefficient to regions between the semiconductor chips with an expansion coefficient which is correspondingly matched to that of the carrier material. This matching of the expansion coefficient of the plastic packaging compound to the components of the semiconductor devices of a panel which are covered by or embedded in the plastic packaging compound reduces the shear stresses between the components and the plastic packaging compound which otherwise occur in conventional semiconductor devices, so that both the risk of distortion and the risk of delamination between the components and the plastic packaging compound is reduced.

In one embodiment of the invention, the level of filler in the plastic packaging compound increases toward the boundary surfaces with the semiconductor chip and is lower between the semiconductor chips. In this context, the level of filler is to be understood as meaning the filling of the plastic packaging compound comprising an epoxy resin with ceramic particles, a high level of filler reducing the coefficient of thermal expansion of the plastic packaging compound and a low level of filler increasing the coefficient to thermal expansion of the plastic packaging compound. Therefore, the plastic packaging compound as filler has ceramic particles, the concentration of which in the plastic packaging compound is higher in the region of the semiconductor chips than between the semiconductor chips. In the region of the semiconductor chips, this coefficient of thermal expansion of the plastic packaging compound of the panel according to the invention is approximately 4 ppm/° C., and between the semiconductor chips this coefficient of thermal expansion rises up to a value of 19 ppm/° C.

In addition to the plastic packaging compound according to the invention with a variable expansion coefficient on the top side of the wiring substrate, the panel also has a patterned soldering stop resist layer on the underside of the wiring substrate, leaving clear outer contact surfaces. The thickness of this soldering stop resist layer is so small that it makes no contribution to compensating for or increasing the distortion and also has no influence on the delamination. However, this soldering stop resist layer is advantageous in order to prevent the solder from spreading onto conduction structures when outer contacts are being soldered onto the outer contact surfaces. For their part, the outer contact surfaces may have surface-mountable outer contacts, these surface-mountable outer contacts having solder balls on the underside of the panel.

A further embodiment of the invention relates to a semiconductor device of a panel, the panel comprising a composite plate with semiconductor device positions arranged in rows and columns. The semiconductor device includes one of the semiconductor device positions and on the top side of a wiring substrate has a semiconductor chip which is arranged in a plastic packaging compound, the rear side of the semiconductor chip being fixed on the wiring substrate and its active top side being electrically connected to the wiring substrate via connecting elements.

The plastic packaging compound embeds the semiconductor chip with the connecting elements, the plastic packaging compound, at the boundary surfaces with the semiconductor chip, having a coefficient of thermal expansion which is matched to that of silicon and, in the region of the outer sides of the plastic package, having a coefficient of thermal expansion which is matched to that of the wiring substrate. The risk of delamination between semiconductor chip and plastic packaging compound and between plastic packaging compound and carrier surface is reduced, thereby simultaneously improving the operational reliability of semiconductor devices of this type.

In a further embodiment of the invention, the semiconductor device has bonding wires, the bonding wires extending from contact surfaces on the active top side of the semiconductor chip to contact connection surfaces on the top side of the wiring substrate. The bonding wires extend through a region of the plastic packaging compound which has a variable coefficient of thermal expansion, the coefficient of thermal expansion being lower in the region of the boundary surfaces with the semiconductor chip than in the region in which the bonding wires meet the contact connection surfaces of the wiring substrate. Therefore, the semiconductor device has a plastic packaging compound which has a higher coefficient of thermal expansion on the outer sides of the semiconductor device than in the interior of the semiconductor device, in particular in the vicinity of the semiconductor chip in the regions in which the bonding wires are arranged on the semiconductor chip.

Like the panel from which the semiconductor chip was taken, the wiring substrate of the semiconductor chip has a patterned soldering stop resist layer on its underside, leaving clear outer contact surfaces. As with the panel, surface-mountable outer contacts, which preferably comprise solder balls, may be arranged on the outer contact surfaces.

A process for producing a panel from a composite plate with semiconductor chips arranged in rows and columns in a plastic packaging compound with a plurality of semiconductor device positions includes the following processes.

A semiconductor wafer with a multiplicity of semiconductor chip positions which are arranged in rows and columns and have active top sides and rear sides is produced. The semiconductor wafer is divided into a multiplicity of semiconductor chips. This is followed by mounting the semiconductor chips on a wiring substrate in semiconductor device positions of the wiring substrate. The rear sides of the semiconductor chips are fixed in rows and columns on the wiring substrate.

This is followed by electrically connecting contact surfaces on the top sides of the semiconductor chip to contact connection surfaces on the top side of the wiring substrate via connecting elements. A plastic packaging compound is applied to the wiring substrate between the semiconductor chips with a coefficient of thermal expansion matched to that of the wiring substrate, and the semiconductor chips are embedded, by way of the edge sides and/or their top sides, in a plastic packaging compound with a coefficient of thermal expansion which is matched to that of the material of the semiconductor chips. It is also possible for this introduction of a plastic packaging compound with different expansion coefficients to be carried out in a plurality of application processes.

The process of mounting semiconductor chips on the wiring substrate in semiconductor device positions can be carried out by means of an automated mounting unit, with the rear sides of the semiconductor chips being fixed in rows and columns onto the top side of the wiring substrate. The process of applying a plastic packaging compound with different coefficients of thermal expansion to the wiring substrate and to the semiconductor chips can be carried out by two successive injection molding processes or two successive dispensing processes.

In one implementation of the process, the process of embedding the semiconductor chips, by way of their edge sides and/or top sides, in a plastic packaging compound with a coefficient of thermal expansion which is matched to that of the material of the semiconductor chip is carried out first of all, and the process of applying a plastic packaging compound to the wiring substrate between the semiconductor chips and to the embedded semiconductor chips, with a coefficient of thermal expansion which is matched to that of the wiring substrate, is only carried out thereafter. This configuration involves first of all using a plastic packaging compound which has a higher ceramic particle filler content than the plastic packaging compound which is used in the subsequent process of applying a plastic packaging compound in the region of the wiring substrate.

In one embodiment, the process of applying a wiring structure to the top side of the wiring substrate to be carried out by applying a metal coating with subsequent patterning by means of photolithography and etching. Even before the division of the panel, it is possible for a soldering stop resist layer to be applied to the underside of the wiring substrate, leaving clear the outer contact surfaces, and then outer contacts in the form of solder balls can be soldered onto the outer contact surfaces which have been left clear.

A process for producing semiconductor devices by means of a panel initially includes the same processes as required to produce the panel. The panel can be divided into individual semiconductor devices even before outer contacts are applied, so that then outer contacts have to be mounted on each individual semiconductor device, or alternatively it is possible for the panel only to be divided once all the outer contacts have already been applied to the underside of the wiring substrate in the semiconductor device positions of the panel.

To apply a wiring structure to the top side of the wiring substrate, first of all a metal layer is applied, which is patterned to form interconnects by means of photolithography and etching, the interconnects extending from contact connection surfaces on the top side of the wiring substrate to through-contacts passing through the wiring substrate, and the through-contacts being electrically connected to outer contact surfaces. The through-contacts for the wiring substrate have already been introduced into the wiring substrate even before semiconductor chips are mounted on the wiring substrate and even before the wiring substrate is covered with a wiring structure.

As has already been mentioned above, the soldering stop resist layer is applied to the underside of the wiring substrate, leaving clear outer contact surfaces, before the panel has been divided into individual semiconductor devices. Therefore, for the individual semiconductor device, there is an underside of the wiring substrate available, on which the outer contact surfaces are uncovered in order for corresponding outer contacts to be mounted on them. Depending on the particular application, outer contacts of this type may be flat in form or may be soldered onto the outer contacts as solder balls.

FIG. 1 illustrates a diagrammatic cross section through a panel 1 in accordance with one embodiment of the invention. For this purpose, the panel 1 has semiconductor device positions 12 which are arranged in rows and columns and are arranged on a composite plate 2 comprising a plastic packaging compound 6 and 7 and a wiring substrate 5. The individual semiconductor device position 12 has a semiconductor chip 3, and in this embodiment of the invention the rear side 8 of this semiconductor chip 3 is arranged on a chip contact surface 25 on the top side 4 of the wiring substrate 5. The active top side 9 of the semiconductor chip 3, and the contact surfaces 22 arranged thereon, are inside a plastic packaging compound 7, which has a lower coefficient of thermal expansion at the boundary surfaces 11 with the semiconductor chip 3 than between the semiconductor chips 3 and above the semiconductor chips 3. The lower coefficient of thermal expansion in the plastic packaging compound 7 is achieved by a concentration of ceramic particles in the plastic packaging compound 7 increasing toward the boundary surfaces 11 of the semiconductor chip 3.

The dot-dashed lines 40 in FIG. 1 denote the boundaries between the semiconductor device positions 12 and show a plastic packaging compound 6 in this region which has a higher coefficient of thermal expansion, which is matched to the coefficient of thermal expansion of the wiring substrate 5, so that a plastic packaging compound 7 which has a lower coefficient of thermal expansion, matched to the coefficient of thermal expansion of the semiconductor chip 3, is arranged only in the interior of each semiconductor device position 12.

On its top side 4, the wiring substrate 5 has a wiring structure 26 which, in addition to the chip contact surfaces 25 which have already been mentioned above, also has contact connection surfaces 23, which are electrically connected to corresponding contact surfaces 22 on the active top side 9 of the semiconductor chip 3 via connecting elements 10 in the form of bonding wires 21. These connecting elements 10 lie in a region of the plastic packaging compound 7 in which the coefficient of thermal expansion gradually varies, from a high expansion coefficient to a lower expansion coefficient, in the direction toward the boundary surfaces 11 with the semiconductor chip 3.

Instead of a wiring substrate and instead of the bonding wires shown here as connecting elements 10, the composite plate 2 illustrated here may also have semiconductor chips 3, the active top side 9 of which is adhesively bonded to a carrier 30, so that the rear side 8 of the semiconductor chips 3 and the edge sides of the semiconductor chips 3 are embedded in a plastic packaging compound, which has a lower coefficient of thermal expansion in the region of the boundary surfaces 11 of the semiconductor chips 3 than between the semiconductor chips 3. Then, to apply a wiring structure and to wire the semiconductor chips 3 for corresponding outer contacts of a panel, the carrier 30 of the composite plate 2 is removed from the plastic packaging compound 6 and 7, so that a coplanar surface made up of top sides 9 of the semiconductor chips 3 and top sides of the plastic packaging compounds 6 and 7 is available for the wiring. For a panel of this type, which makes do without a wiring substrate and provides a wiring structure directly on the plastic packaging compounds 6 and 7 and the top sides 9 of the semiconductor chips 3, it is likewise advantageous if the thermal expansion properties of the plastic packaging compound 7 are matched to the coefficient of thermal expansion of the semiconductor chips 3 in the region of the boundary surfaces 11 with the semiconductor chip 3 and the conventional coefficient of thermal expansion of the plastic packaging compound 6 is present at a distance from the semiconductor chips 3.

FIGS. 2 to 8 illustrate diagrammatic cross sections through intermediate products formed during the production of a panel as illustrated in FIG. 1. These production processes presuppose a wiring substrate 5 on which a panel is built up. However, it is also possible, as has already been mentioned above, instead of the wiring substrate 5 just to provide a carrier 30 in order to create a panel 1 which has coplanar surfaces composed of top sides 9 of semiconductor chips 3 and top sides of plastic packaging compounds 6 and 7. Components with the same functions as in FIG. 1 are denoted by the same reference numerals in FIGS. 2 to 8 and are not explained again.

FIG. 2 illustrates a diagrammatic cross section through a wiring substrate 5 with contact connection surfaces 23 and chip contact surfaces 25 of a wiring structure 26, which is arranged on the top side 5 of a wiring substrate 5. The further structure of the wiring substrate 5 with through-contacts and outer contact surfaces on the underside 13 of the wiring substrate 5 is omitted from FIG. 2 for the sake of simplicity. Through-contacts and outer contact surfaces of this type do not exist in embodiments of the invention in which just a carrier 30 is used instead of the wiring substrate 5. For this purpose, the top side 4 of the carrier 30 is covered with a double-sided adhesive film, to which the active top sides of semiconductor chips can be fixed.

FIG. 3 illustrates a diagrammatic cross section through the wiring substrate 5 as illustrated in FIG. 2 after application of semiconductor chips 3 in semiconductor device positions 12 of the wiring substrate 5. For this purpose, the rear sides 8 of the semiconductor chips 3 are fixed on the chip contact surfaces 25, the chip contact surfaces 25 being connected to the contact connection surfaces 23 via interconnects of the wiring structure 26.

FIG. 4 illustrates a diagrammatic cross section through the wiring substrate 5 illustrated in FIG. 3 after the application of connecting elements 10. In this embodiment of the invention, these connecting elements 10 are bonding wires 21 which are bonded from contact surfaces 22 on the active top side 9 of the semiconductor chip 3 to contact connection surfaces 23 on the top side 4 of the wiring substrate 5. In an alternative embodiment of a panel, bonding wires of this type can be dispensed with, since the active top sides 9 of the semiconductor chips 3 form a coplanar surface on the plastic packaging compound 6, 7, to which coplanar surface a wiring structure 26 can be applied flat without the need for three-dimensional connecting elements.

FIG. 5 illustrates a diagrammatic cross section through the wiring substrate 5 illustrated in FIG. 4 after a plastic packaging compound 7 with a low coefficient of thermal expansion has been applied to the boundary surfaces 11 of the semiconductor chip 3. This plastic packaging compound 7, which primarily encloses the bonding wires 21 in this embodiment of the invention, is characterized in that its expansion coefficient gradually decreases in the direction of the boundary surfaces 11 of the semiconductor chips 3 and in the region of the boundary surfaces 11 of the semiconductor chips 3 has a coefficient of thermal expansion of approximately 4 ppm/° C., which virtually corresponds to the coefficient of thermal expansion of the silicon from which the semiconductor chip 3 is produced. This plastic packaging compound 7, the coefficient of thermal expansion of which gradually varies in the direction of the boundary surfaces 11 of the semiconductor chip 3, has the effect of reducing the risk of delamination for the subsequent semiconductor device. The susceptibility of the panel to distortion is also reduced as a result.

Figure 6:
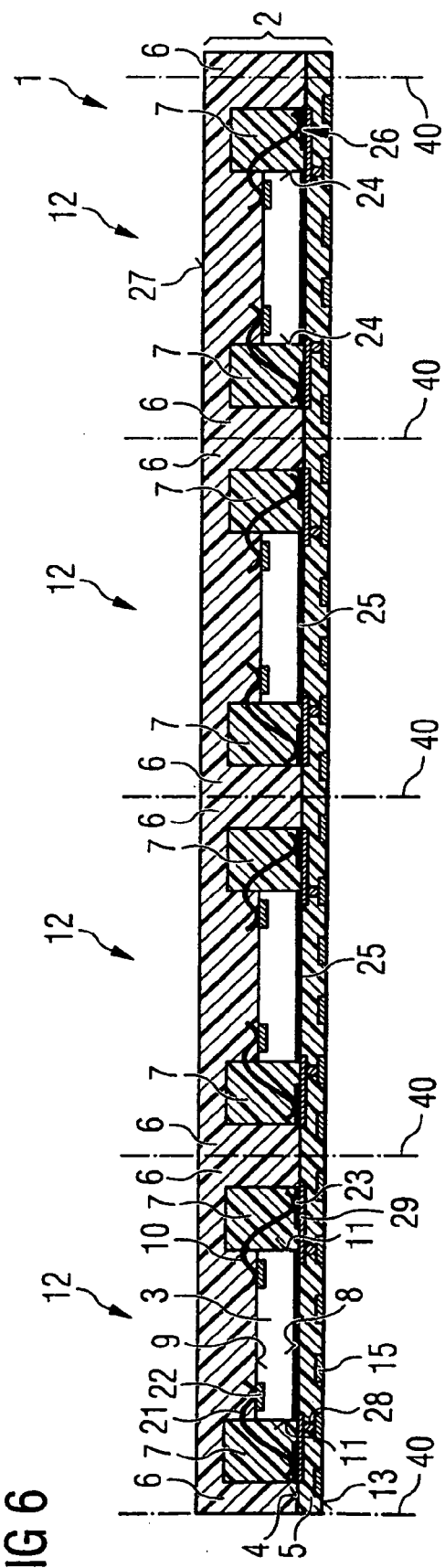

FIG. 6 illustrates a diagrammatic cross section through a composite plate 2 after application of a plastic packaging compound 6 to the wiring substrate 5 illustrated in FIG. 5, this plastic packaging compound 6 now covering the entire surface 4 of the wiring substrate and providing a planar top side 27 for a panel 1, which is simultaneously the top side 27 of the individual semiconductor devices. The plastic packaging compound 6 which is applied in this process as illustrated in FIG. 6 has a higher coefficient of thermal expansion than the plastic packaging compound 7 applied in the previous step, which is illustrated in FIG. 5. The coefficient of thermal expansion of this plastic packaging compound 6 is matched to the coefficient of thermal expansion of the wiring substrate 5, so that the risk of delamination between the plastic packaging compound 6 and the wiring substrate 5 is reduced.

Figure 7:
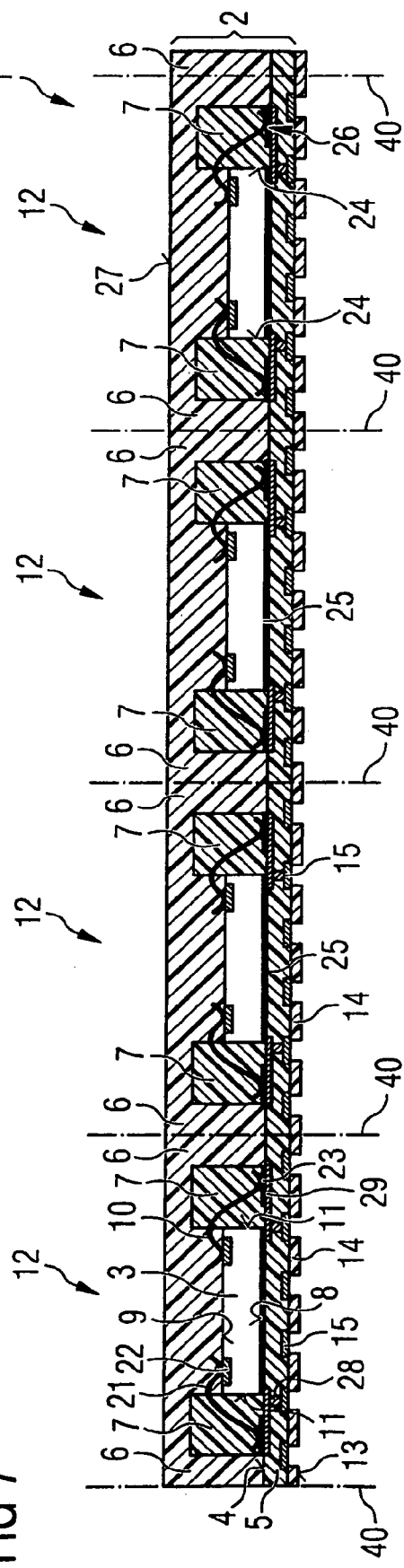

FIG. 7 illustrates a diagrammatic cross section through a panel 1 after application of a soldering stop resist layer 14 to the underside 13 of the wiring substrate 5 as illustrated in FIG. 6. This soldering stop resist layer 14 leaves clear outer contact surfaces 15 on the underside 13 of the wiring substrate 5, so that these outer contact surfaces 15 can then be covered with outer contacts. For their part, the outer contact surfaces 15 are connected to the contact connection surfaces 23 via through-contacts 28 passing through the wiring substrate 5 and via interconnects 29 of the wiring structure 26 on the top side 4 of the wiring substrate 5, thereby producing a direct electrical connection between the contact surfaces 22 on the active top side 9 of the semiconductor chip 3 and the outer contact surfaces 15.

FIG. 8 illustrates a diagrammatic cross section through a panel 1 after application of outer contacts 16 to the underside 13 of the wiring substrate 5. In this embodiment of the invention, the outer contacts 16 are solder balls 17 which are soldered onto the outer contact surfaces 15 of the panel 1. The application of the outer contacts 16 to the underside 13 of the wiring substrate 5 of the panel 1 in practice concludes the production of a plurality of semiconductor devices, so that all that is then required is a dividing process along the dot-dashed lines 40 in order to obtain the semiconductor device 20 illustrated in FIG. 9.

FIG. 9 illustrates a diagrammatic cross section through a semiconductor device 20 after the panel 1 illustrated in FIG. 8 has been divided. Components having the same functions as in the previous figures are denoted by the same reference numerals and are not explained again.

A characteristic feature of this semiconductor device 20 is that the plastic packaging compound 6 has a lower coefficient of thermal expansion on the outer sides 18 of the plastic package 19 than in the interior of the semiconductor device 20, in particular in the region of the edge sides 24 of the semiconductor chip 3 adjoining the plastic packaging compound 7, which in this region has a lower coefficient of thermal expansion than the plastic packaging compound 6 on the edge sides 18 of the semiconductor device 20, the plastic packaging compound 7, by virtue of correspondingly high levels of filler, having a coefficient of thermal expansion which is matched to the coefficient of thermal expansion of the silicon of the semiconductor chip 3.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A process for producing a panel comprising a composite plate with semiconductor chips arranged in rows and columns in a plastic packaging compound having a plurality of semiconductor device positions, comprising:
producing a semiconductor wafer with a multiplicity of semiconductor chip positions which are arranged in rows and columns and have active top sides and rear sides;
dividing the semiconductor wafer into a multiplicity of semiconductor chips;
mounting semiconductor chips on a wiring substrate in semiconductor device positions, the rear sides of the semiconductor chips being fixed on the wiring substrate in rows and columns;
electrically connecting contact surfaces on the top sides of the semiconductor chips to contact connection surfaces on the top side of the wiring substrate via connecting elements; and
applying a first plastic packaging compound to the wiring substrate between the semiconductor chips such that a concentration of ceramic particles in the plastic packaging compound increases towards boundary surfaces of the semiconductor chip and the first plastic packaging compound has a first coefficient of thermal expansion which is matched to the wiring substrate, and embedding the semiconductor chips, by way of their edge sides and/or top sides, in a second plastic packaging compound with a second coefficient of thermal expansion which is matched to the material of the semiconductor chips.

2. The process as claimed in claim 1, comprising wherein dividing the semiconductor wafer into a multiplicity of semiconductor chips is carried out by sawing.

3. The process as claimed in claim 1, comprising wherein mounting semiconductor chips on the wiring substrate in semiconductor device positions is carried out by means of an automated mounting unit, the rear sides of the semiconductor chips being fixed in rows and columns on the top side of the wiring substrate.

4. The process as claimed in claim 1, comprising wherein applying the first and second plastic packaging compounds with respective first and second coefficients of thermal expansion to the wiring substrate and to the semiconductor chips is carried out by two successive injection molding steps.

5. The process as claimed in claim 1, comprising wherein applying the first and second plastic packaging compounds with respective first and second coefficients of thermal expansion to the wiring substrate and to the semiconductor chips is carried out by two successive dispensing steps.

6. The process as claimed in claim 1, comprising wherein embedding of the semiconductor chips by way of their edge sides and/or top sides in the second plastic packaging compound with a second coefficient of thermal expansion which is matched to that of the material of the semiconductor chips is carried out first of all, and then the application of the first plastic packaging compound to the wiring substrate between the semiconductor chips and to the embedded semiconductor chips with the first coefficient of thermal expansion which is matched to the wiring substrate is carried out.

7. The process as claimed in claim 1, comprising wherein application of a wiring structure to the top side of the wiring substrate is carried out by applying a metal coating with subsequent patterning by means of photolithography and etching.

8. The process as claimed in claim 1, comprising wherein prior to the panel being divided, outer contacts are mounted on the underside of the wiring substrate.

9. The process as claimed in claim 1, comprising wherein the first plastic packaging applied to the wiring substrate between the semiconductor chips has a thermal expansion coefficient that gradually varies in the direction of the boundary surfaces of the semiconductor chips.

10. The process as claimed in claim 1, comprising wherein the first plastic packaging applied to the wiring substrate between the semiconductor chips has a thermal expansion coefficient that gradually decreases in the direction of the boundary surfaces of the semiconductor chips.

11. A process for producing semiconductor devices by means of a panel, comprising:

producing a semiconductor wafer having a multiplicity of semiconductor chip positions which are arranged in rows and columns and have active top sides and rear sides;

dividing the semiconductor wafer into a multiplicity of semiconductor chips;

mounting semiconductor chips on a wiring substrate in semiconductor device positions, the rear sides of the semiconductor chips being fixed on the wiring substrate in rows and columns;

electrically connecting contact surfaces on the top sides of the semiconductor chips to contact connection surfaces on the top side of the wiring substrate via connecting elements;

applying a first plastic packaging compound to the wiring substrate between the semiconductor chips such that a concentration of ceramic particles in the plastic packaging compound increases towards boundary surfaces of the semiconductor chip and the first plastic packaging compound has a first coefficient of thermal expansion which is matched to the wiring substrate, and embedding the semiconductor chips, by way of their edge sides and/or top sides, in a second plastic packaging compound with a second coefficient of thermal expansion which is matched to the material of the semiconductor chips; and dividing the panel into individual semiconductor devices.

12. The process as claimed in claim 11, comprising wherein to apply a wiring structure, a metal layer is applied to the top side of the wiring substrate and is patterned to form interconnects by means of photolithography and etching, the interconnects extending from contact connection surfaces on the top side of the wiring substrate to through-contacts passing through the wiring substrate, and the through-contacts being electrically connected to outer contact surfaces.

13. The process as claimed in claim 12, comprising wherein a patterned soldering stop resist layer is applied to the underside of the wiring substrate, leaving clear the outer contact surfaces, prior to the division into individual semiconductor devices.

14. The process as claimed in claim 13, comprising wherein surface-mountable outer contacts are applied to the outer contact surfaces.

15. The process as claimed in claim 14, comprising wherein solder balls are soldered onto the outer contact surfaces as surface-mountable outer contacts.

16. The process as claimed in claim 11, comprising wherein the first plastic packaging applied to the wiring substrate between the semiconductor chips has a thermal expansion coefficient that gradually varies in the direction of the boundary surfaces of the semiconductor chips.

17. The process as claimed in claim 11, comprising wherein the first plastic packaging applied to the wiring substrate between the semiconductor chips has a thermal expansion coefficient that gradually decreases in the direction of the boundary surfaces of the semiconductor chips.

* * * * *

UNITED STATES PATENT AND TRADEMARK OFFICE
CERTIFICATE OF CORRECTION

PATENT NO. : 7,713,791 B2  Page 1 of 1
APPLICATION NO. : 11/437304
DATED : May 11, 2010
INVENTOR(S) : Bauer et al.

It is certified that error appears in the above-identified patent and that said Letters Patent is hereby corrected as shown below:

On the Title Page Item (75), Inventors, delete "Hermann Vilsmeier, Regensburg (DE)" and insert in place thereof --Hermann Vilsmeier, Munich (DE)--.

Signed and Sealed this

Fifth Day of October, 2010

David J. Kappos
*Director of the United States Patent and Trademark Office*